US006888719B1

(12) United States Patent
Janzen et al.

(10) Patent No.: US 6,888,719 B1
(45) Date of Patent: May 3, 2005

(54) METHODS AND APPARATUSES FOR TRANSFERRING HEAT FROM MICROELECTRONIC DEVICE MODULES

(75) Inventors: Jeffery W. Janzen, Meridian, ID (US); Christopher S. Johnson, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 21 days.

(21) Appl. No.: 10/686,864

(22) Filed: Oct. 16, 2003

(51) Int. Cl.⁷ ............................................... G06F 1/20
(52) U.S. Cl. ..................... 361/687; 361/783; 257/703; 204/450
(58) Field of Search ........................ 361/679–687, 361/676, 760, 807, 783; 257/676, 686, 699–703, 666; 363/144; 204/450

(56) References Cited

U.S. PATENT DOCUMENTS

| | | |
|---|---|---|
| 5,729,052 A | 3/1998 | Tonti et al. |
| 5,866,953 A | 2/1999 | Akram et al. |
| 5,883,426 A | 3/1999 | Tokuno et al. |
| 5,989,941 A | 11/1999 | Wensel |
| 6,046,496 A | 4/2000 | Corisis et al. |
| 6,048,744 A | 4/2000 | Corisis et al. |
| 6,049,125 A | 4/2000 | Brooks et al. |
| 6,075,288 A | 6/2000 | Akram |
| 6,122,171 A | 9/2000 | Akram et al. |
| 6,148,509 A | 11/2000 | Schoenfeld et al. |
| 6,153,924 A | 11/2000 | Kinsman |
| 6,159,764 A | 12/2000 | Kinsman et al. |
| 6,163,956 A | 12/2000 | Corisis |
| 6,208,519 B1 | 3/2001 | Jiang et al. |
| 6,215,175 B1 | 4/2001 | Kinsman |
| 6,252,772 B1 | 6/2001 | Allen |
| 6,303,981 B1 | 10/2001 | Moden |
| 6,314,639 B1 | 11/2001 | Corisis |
| 6,326,242 B1 | 12/2001 | Brooks et al. |
| 6,326,687 B1 * | 12/2001 | Corisis ....................... 257/713 |
| 6,344,976 B1 * | 2/2002 | Schoenfeld et al. ........ 361/813 |
| 2003/0128523 A1 * | 7/2003 | Moden et al. .............. 361/719 |
| 2004/0240245 A1 * | 12/2004 | Kenny, Jr. et al. .......... 363/144 |

OTHER PUBLICATIONS

Molex Inc., SIMM Socket 78976 Datasheet, 1 page, 2002, retrieved from the Internet on Jun. 3, 2003, <http://www.molex.com>.

(Continued)

Primary Examiner—Hung Van Duong
(74) Attorney, Agent, or Firm—Perkins Coie LLP (57) ABSTRACT

Methods and apparatuses for transferring heat from microelectronic device modules are disclosed. An apparatus in accordance with one embodiment of the invention can include first and second heat transfer portions positioned to face toward opposing faces of a microelectronic device module. Heat transfer fins having different length can extend away from at least one of the heat transfer portions. In one embodiment, the heat transfer fins can be integrally formed with other portions of the apparatus. In other embodiments, modules carrying the heat transfer devices can be mounted at an acute angle relative to a support structure (such as a PCB) so that heat transfer fins from one module can extend adjacent to the end region of the neighboring module. This arrangement can increase the rate at which heat is transferred away from the modules, and can increase the utilization of a limited heat transfer volume within a device, such as a computer.

38 Claims, 5 Drawing Sheets

OTHER PUBLICATIONS

Str8buy.com, Thermaltake Memory Cooling Kits, Heat Sink and Heat Spreader, 3 pages, retrieved from the Internet on May 9, 2003, <http://www.str8buy.com/thmecokihean.html>.

Thermaltake Technology Co., Ltd., Thermaltake DDR Copper Heat Spreader, 2 pages, 2001, retrieved from the Internet on May 9, 2003, <http://www.thermaltake.com/products/memory/ddrCopper.htm>.

Samsung Electronics Co., Ltd., MR16R1622(4/8/G)DFO, MR18R1622(4/8/G)DFO RIMM™ Module Datasheet, Jul. 2002, 16 pages, retrieved from the Internet, <http://www.samsung.com/Products/Semiconductor/DRAM/RDRAM/RDRAMmodule/Norm aIRIMM/MR16R1622DFO/ds_mr16(8)r1622(4_8_g)df0.pdf>.

Francis, David, and Linda Jardine, "Reducing The Thermal Resistance of CSPs and Flip Chip ICs," 4 pages, Chip Scale Review, Nov.–Dec. 1998, San Jose, California.

Karl, Haut, "Removing Your Integrated Heat Spreader," 4 pages, Oct. 8, 2002, retrieved from the Internet, <http://www.geocities.com/_lunchbox/remove_integrated_heat_spreader.html>.

Thermalmasters Inc., VGA/Chipset Cooler, 2 pagers, retrieved from the Internet on May 9, 2003, <http://www.thermalmasters.com/vgachipcool.html>.

* cited by examiner

METHODS AND APPARATUSES FOR TRANSFERRING HEAT FROM MICROELECTRONIC DEVICE MODULES

TECHNICAL FIELD

The present invention relates generally to methods and apparatuses for transferring heat from microelectronic device modules.

BACKGROUND

In response to end-user demand, the computer industry has continually reduced the size of computer components while increasing the capabilities of the components. As the size of computer components decreases and the computing power of these components increases, it becomes increasingly difficult to transfer heat away from the components at an adequate rate. As a result, some components can overheat and fail. In other cases, the speed and/or other operating parameters of the components can become limited by the inability to reject heat from the components at a rapid enough rate.

Figure 1A:
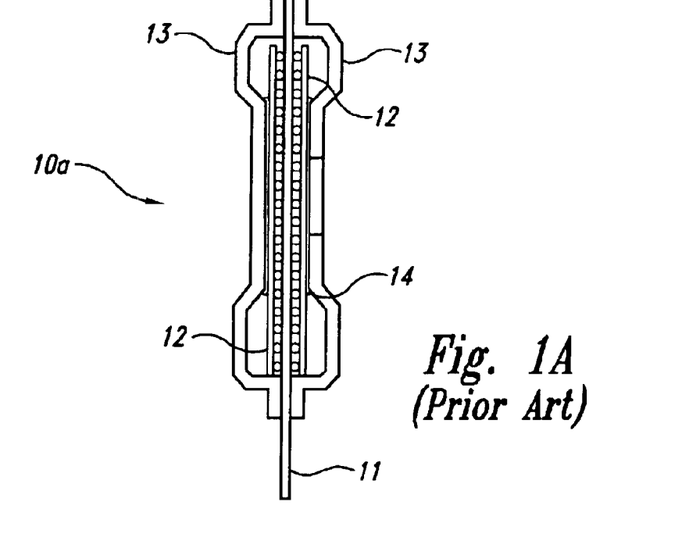
FIGS. 1A–1B illustrate packaged chip module assemblies having heat transfer devices in accordance with the prior art.

One approach to addressing the foregoing problems has been to use heat transfer devices to accelerate the rate at which heat is rejected from computer components. For example, as shown in FIG. 1A, a module assembly. 10a in accordance with the prior art can include a printed circuit board 11 which carries two packaged chips 12. Heat spreaders 13 are attached to each side of the printed circuit board 11 proximate to the packaged chips 12. A thermally conductive gap filler 14 is disposed between each heat spreader 13 and the adjacent packaged chip 12. Accordingly, the heat spreaders 13 can provide additional surface area (beyond that of the packaged chips 12 themselves) by which to convectively remove heat from the packaged chips 12. Devices such as those shown in FIG. 1A are available from Rambus of Los Altos, Calif.

Figure 1B:
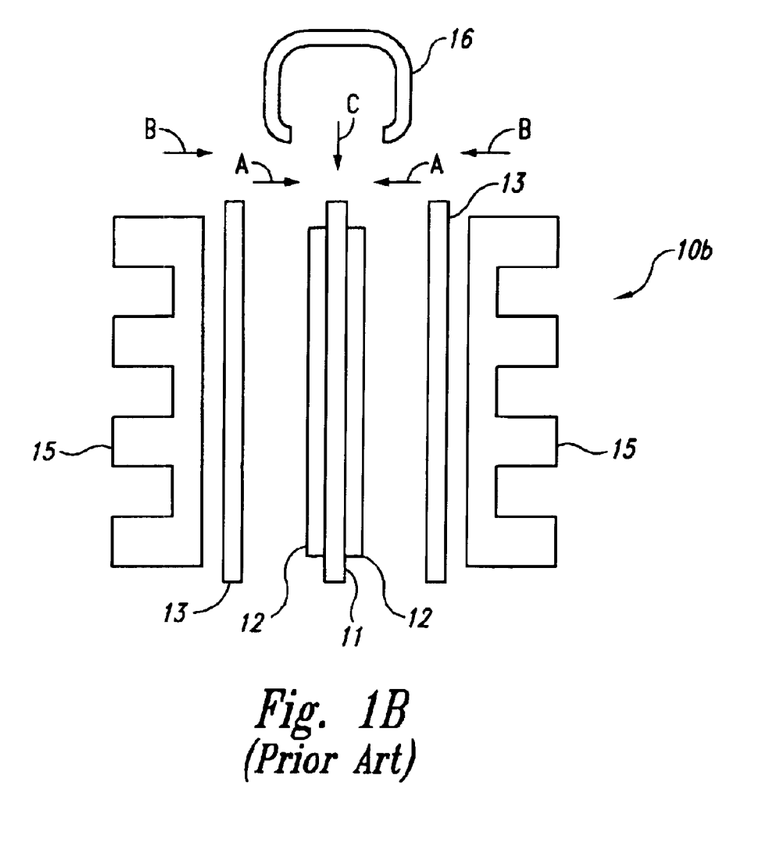

One potential drawback with the device shown in FIG. 1A is that the heat spreaders 13 alone may not be adequate to cool the packaged chips 12 at a rapid enough rate. One approach to addressing this potential drawback is to add a finned heat sink to the module assembly 10a. For example, as shown in FIG. 1B, a module assembly 10b in accordance with another aspect of the prior art includes two heat sinks 15, one disposed adjacent to each of the heat spreaders 13. The heat spreaders 13 are positioned adjacent to the packaged chips 12 (as indicated by arrows A), the heat sinks 15 are positioned against the heat spreaders 13 (as indicated by arrows B), and a clip 16 is disposed around the module assembly 10b (as indicated by arrow C) to keep the components in close thermal contact with each other.

One drawback with the module assembly 10b shown in FIG. 1B is that the fins of the heat sinks 15 can preclude spacing adjacent module assemblies 10b close to each other and can therefore make it difficult to decrease the size of the computer or other electronic device into which the module assemblies 10 are installed. Another drawback is that the relatively large number of components included in each module assembly 10b can make assembling the module 10b a time consuming process, and can reduce the thermal continuity between one component and the next.

DETAILED DESCRIPTION

A. Introduction

The present invention is directed to methods and apparatuses for transferring heat from microelectronic devices, including, but not limited to, packaged memory chips. An apparatus in accordance with one embodiment of the invention includes a first heat transfer portion positioned to face toward a first surface of a computer chip module, and a second heat transfer portion positioned to face toward a second surface of the computer chip module. The second heat transfer portion can face generally opposite from the first heat transfer portion, and at least a part of the first heat transfer portion can be spaced apart from the second heat transfer portion to receive the computer chip module. An intermediate portion can be disposed between the first and second heat transfer portions, and the apparatus can further include first and second heat transfer fins that each extend away from at least one of the first heat transfer portion, the second heat transfer portion, and the intermediate portion. The first heat transfer fin can have a first length, and the second heat transfer fin can have a second length different than the first length. In another aspect of the invention, the heat transfer fins can be integrally formed with at least one of the foregoing portions.

A computer assembly in accordance with another aspect of the invention includes a support and a first connector carried by the support. The first connector can have a receptacle with a first insertion axis positioned at an acute first angle relative to the support. A second connector carried by the support can have a receptacle with a second insertion axis positioned at an acute second angle relative to the support. The assembly can further include a first module having a first end region spaced apart from the support and being received in the first receptacle. A second module having a second end region spaced apart from the support can be received in the second receptacle. A first heat sink carried by the first module can have at least one first fin oriented at an acute third angle relative to the support, and a second heat sink carried by the second module can have at least one second fin oriented at an acute fourth angle relative to the support. The at least one second fin can be positioned proximate to the first end region of the first module, with the first end region being interposed between the at least one second fin and the support.

A method in accordance with another aspect of the invention includes mounting a first connector to a support, the first connector having a receptacle with a first insertion axis positioned at an acute first angle relative to the support. A second connector can be mounted to the support and can have a receptacle with a second insertion axis positioned at an acute second angle relative to the support. The method can further include receiving a first module in the first receptacle, receiving a second module in the second receptacle, positioning a first heat sink in thermal communication with the first module, and positioning a second heat sink in thermal communication with the second module. At least one fin of the second heat sink can be positioned proximate to an end region of the first module, with the end region of the first module being interposed between the at least one second fin and the support.

B. Apparatuses and Methods in Accordance with Embodiments of the Invention

Several specific details of the invention are set forth in the following description and in FIGS. 2–4D to provide a thorough understanding of certain embodiments of the invention. One skilled in the art, however, will understand that the present invention may have additional embodiments, and that other embodiments of the invention may be practiced without several of the specific features explained in the following description.

Figure 2:
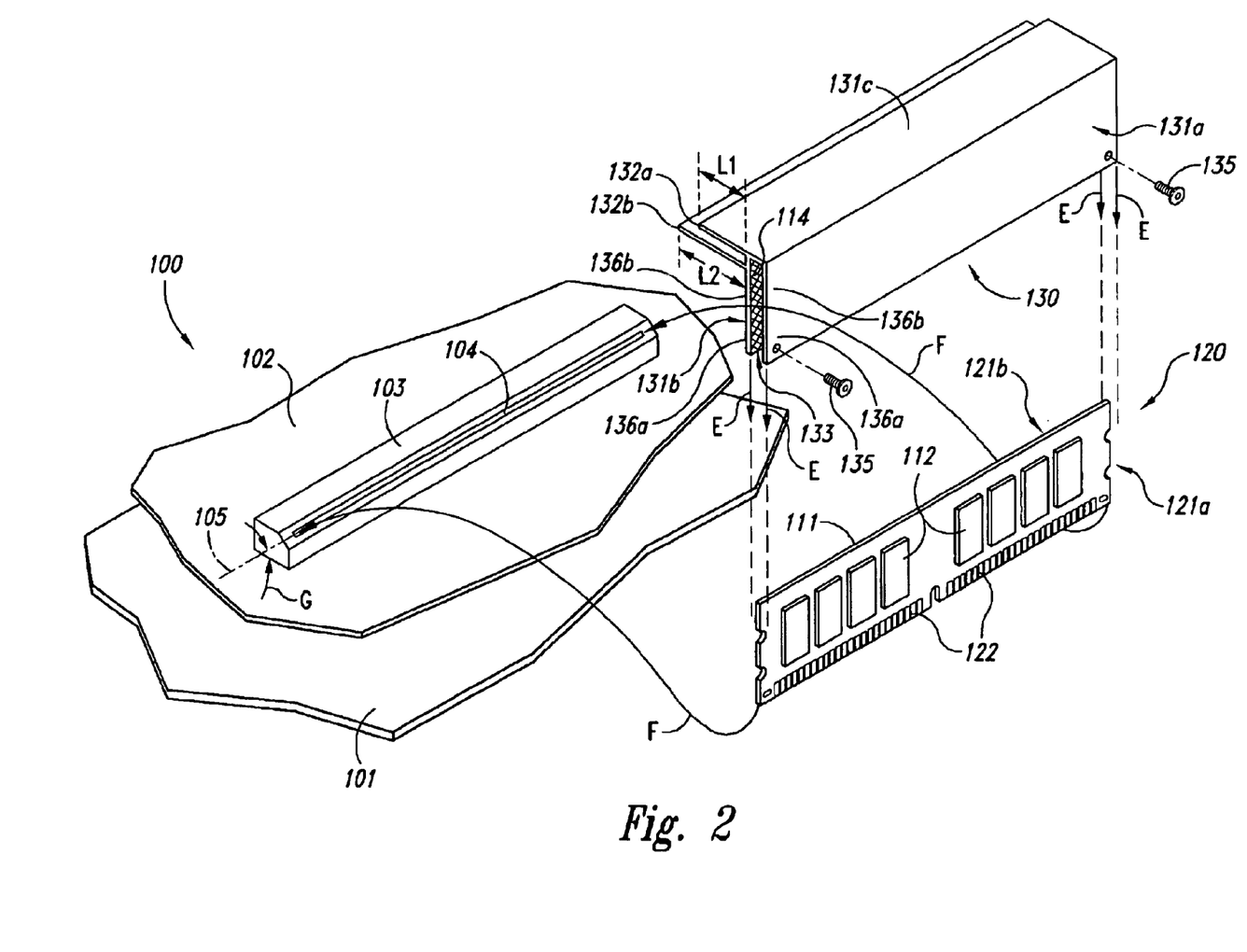
FIG. 2 is a partially schematic, isometric exploded illustration of a module assembly having a heat transfer device in accordance with an embodiment of the invention.

FIG. 2 is a partially schematic, partially exploded view of a portion of a computer or other electronic device 100 having components cooled in accordance with an embodiment of the invention. In one aspect of this embodiment, the components can include microelectronic devices 112 mounted to a substrate 111 to form a module 120. In one aspect of this embodiment, the substrate 111 can include a printed circuit board (PCB), and the microelectronic devices 112 can include packaged memory chips. In other embodiments, the substrate 111 can include other structures, and/or the microelectronic devices 112 can have other structures and/or functions. In any of these embodiments, the microelectronic devices 112 can be electrically coupled to contacts 122 for electrical communication with other devices located off the module 120. The module 120 can include a first side 121a facing opposite from a second side 121b. In one aspect of this embodiment, both the first side 121a and the second side 121b can include microelectronic devices 112 or other microelectronic devices. In other embodiments, only a single side 121 of the module 120 can include such devices, as described in greater detail below with reference to FIG. 4A. In any of these embodiments, the microelectronic devices 112 can be cooled with an integrally formed, finned heat transfer device, as described in greater detail below.

In one aspect of an embodiment shown in FIG. 2, the module 120 can be cooled with a heat transfer device 130 having a first portion 131a and a second portion 131b. Each of the first and second portions 131a, 131b can have a first region 136a and a second region 136b. The first regions 136a can be separated by a gap 133, and the second regions 136b can be connected with an intermediate portion 131c. The heat transfer device 130 can further include one or more heat transfer fins 132 (two are shown in FIG. 2 as a first fin 132a and a second fin 132b). In one aspect of this embodiment, the first fin 132a can have a first length L1, and the second fin 132b can have a second L2 that is different than the first length L1. As will be described in greater detail below with reference to FIG. 3, the different lengths of the first and second fins 132a, 132b can provide for an enhanced rate of heat rejection from the module 120, while also allowing adjacent modules 120 to be positioned closely to each other.

To assemble the heat transfer device 130 with the module 120, the heat transfer device 130 can be positioned over the module 120, as indicated by arrows E so that the module 120 is received in the gap 133. In one aspect of this embodiment, a thermally conductive paste or other formable, thermally conductive material 114 can be disposed on the outward facing surfaces of the microelectronic devices 112, and/or on the inward facing surfaces of the first and second portions 131a, 131b. The thermally conductive material 114 can increase the rate at which heat is transferred from the microelectronic devices 112 to the first and second portions 131a, 131b. The heat transfer device 130 can be attached to the module 120 with an adhesive, or with mechanical fasteners 135, or with the friction between the surfaces of the microelectronic devices 112 and the first and second portions 131a, 131b.

In one aspect of the foregoing embodiments, the heat transfer device 130 can include a highly thermally conductive metallic material, such as aluminum or copper. In other embodiments, the heat transfer device 130 can include other metallic or nonmetallic materials that are also highly thermally conductive. In any of these embodiments, the fins 132 can be integrally formed with the other portions of the heat transfer device 130, (e.g., the first, second, and intermediate portions 131a–131c). For example, the entire heat transfer device 130 can be molded as a single piece so as to have no readily separable mechanical connections between its component parts. An advantage of this arrangement is that the heat transfer device 130 can provide a single, continuous and uninterrupted heat conductive path between the microelectronic devices 112 and the environment external to the module 120. A further advantage is that the heat transfer device 130 can be less time consuming to install on the module 120.

The module 120 can be electrically coupled to the computer 100 before or after the heat transfer device 130 is coupled to the module 120. In one embodiment, the computer 100 includes a chassis 101 (a portion of which is visible in FIG. 2) and a support 102 positioned to receive the module 120. The support 102 can include a printed circuit board, (e.g., a motherboard), or another suitable support structure. The support 102 can also include a connector 103 having a receptacle 104 positioned to receive the contacts 122 of the module 120. In one aspect of this embodiment, the receptacle 104 can have a slot configuration to receive the contacts 122. Accordingly, the module 120 can be inserted into the receptacle 104 along an insertion axis 105, as indicated by arrows F. In one aspect of this embodiment, the insertion axis 105 can be inclined relative to the support 102 at an acute angle G. As described in greater detail below with reference to FIG. 3, this arrangement can allow multiple modules 120 to be positioned in close proximity to each other while also allowing heat to be transferred away from the first and second fins 132a, 132b at a relatively high rate.

Figure 3:
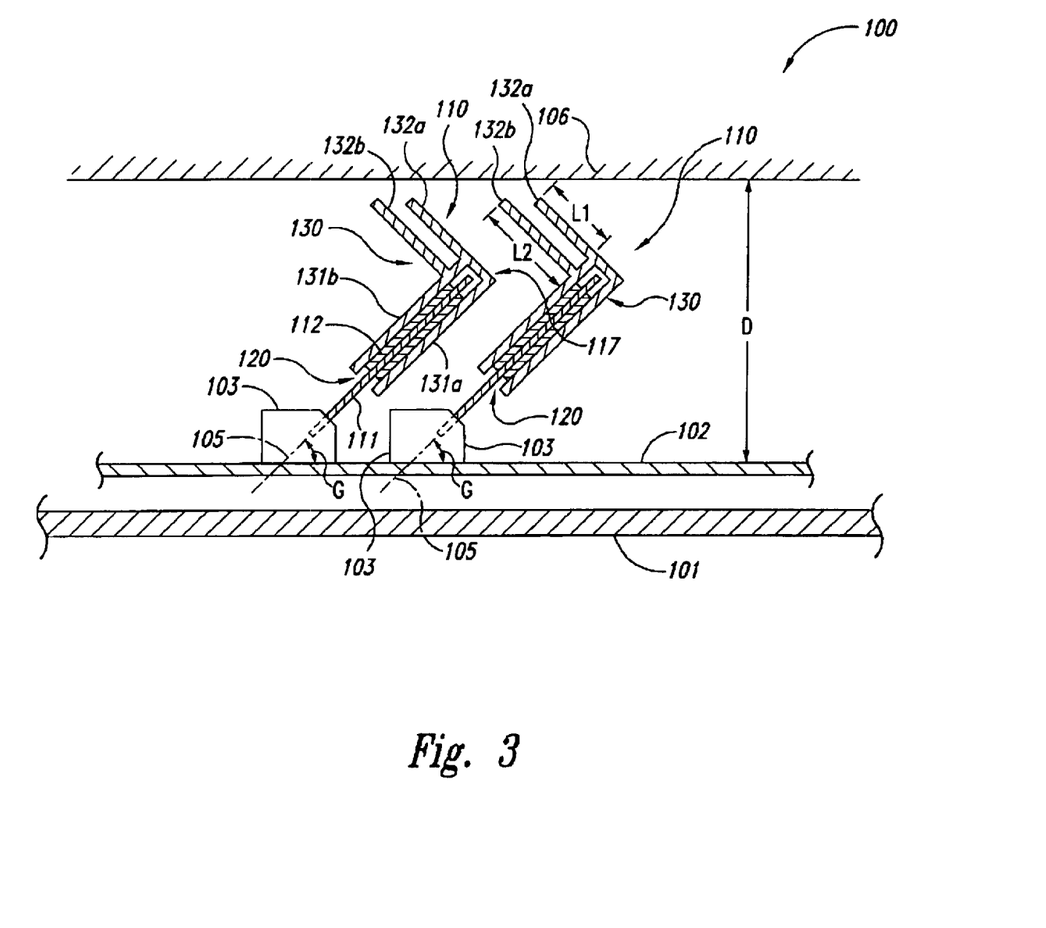
FIG. 3 is a partially schematic, cross-sectional illustration of a plurality of module assemblies installed in a computer in accordance with an embodiment of the invention.

FIG. 3 is a partially schematic, cross-sectional illustration of the computer 100 with a plurality of module assemblies 110 installed in accordance with an embodiment of the invention. In one aspect of this embodiment, each module assembly 110 can include a module 120 and a heat transfer device 130. Each module assembly 110 can be inserted into a corresponding connector 103 and can accordingly be inclined at the acute angle G relative to the support 102. In one embodiment, angle G can have a value of from about 30 degrees to about 60 degrees relative to the support 102. In a particular aspect of this embodiment, the angle G can have a value of about 45 degrees. In other embodiments, the angle G can have other acute values. In any of the foregoing embodiments, the fins 132a, 132b of one module assembly 110 can extend adjacent to the fins 132a, 132b and an end region 117 of an adjacent module assembly 110. An advantage of this arrangement is that the module assemblies 110 can be installed in close proximity to each other without the fins 132a, 132b of one module assembly 110 interfering with the fins 132a, 132b of its neighbor. Suitable connectors 103 having the foregoing features are available from Molex, Inc. of Lisle, Ill.

In one embodiment, the computer 100 can include an adjacent structure 106 positioned proximate to the support 102 and the module assemblies 110. In a particular aspect of this embodiment, the adjacent structure 106 can include a power supply or a portion of the chassis 101. In other embodiments, the adjacent structure 106 can include other components. In any of these embodiments, the adjacent structure 106 can be spaced apart from the support 102 by a distance D. Accordingly, the fins 132a, 132b can be sized to come close to or touch the adjacent structure 106. In still another aspect of this embodiment, the longer fin 132b is positioned closer to the corresponding connector 103 than is the shorter fin 132a. This arrangement is possible in part because the module assemblies 110 are inclined at the acute angle G relative to the support 102. An advantage of this arrangement is that the longer fin 132b can increase the rate at which heat is transferred away from the module assembly 120. Accordingly, providing the heat sink 130 with fins having different lengths can make increased use of the limited space available between the support 102 and the adjacent structure 106.

Figure 4A:
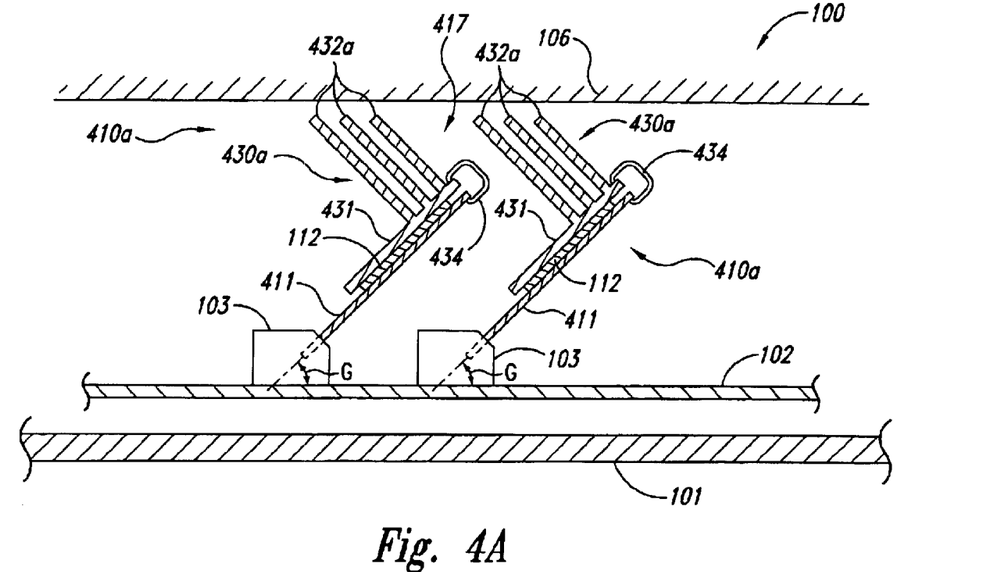
FIGS. 4A–4D are partially schematic, cross-sectional illustrations of module assemblies having heat transfer devices in accordance with further embodiments of the invention.

In other embodiments, a computer or other electronic device 100 can carry module assemblies having different arrangements. For example, as shown in FIG. 4A, the computer 100 can carry module assemblies 410a, each of which includes microelectronic devices 112 positioned on only one side of a substrate 411. A corresponding heat transfer device 430a of each module assembly 410a can accordingly include a heat transfer portion 431 carrying a plurality of heat transfer fins 432a (three are shown in FIG. 4A). In one aspect of this embodiment, the heat transfer device 430a can be releasably attached to the module 420 with a clip 434. In other embodiments, the heat transfer device 430a can be coupled to the module 420 with other devices. In any of these embodiments, the module assemblies 410a can be oriented at an acute angle G relative to the support 102, and the heat transfer fins 432a can extend adjacent to an end region 417 of the neighboring module assembly 410a. Adjacent heat transfer fins 432a can have different lengths to take advantage of the tapered volume between the module 420 and the adjacent structure 106. Accordingly, the module assemblies 410a can be relatively closely spaced while still providing a relatively high rate of heat transfer from the microelectronic devices 112.

Figure 4B:
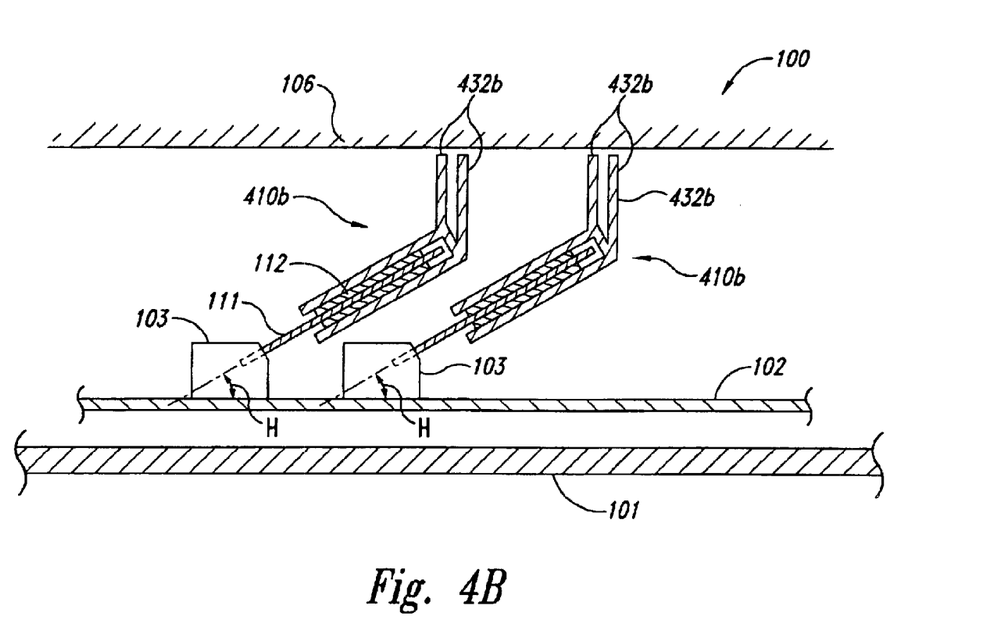
Figure 4C:
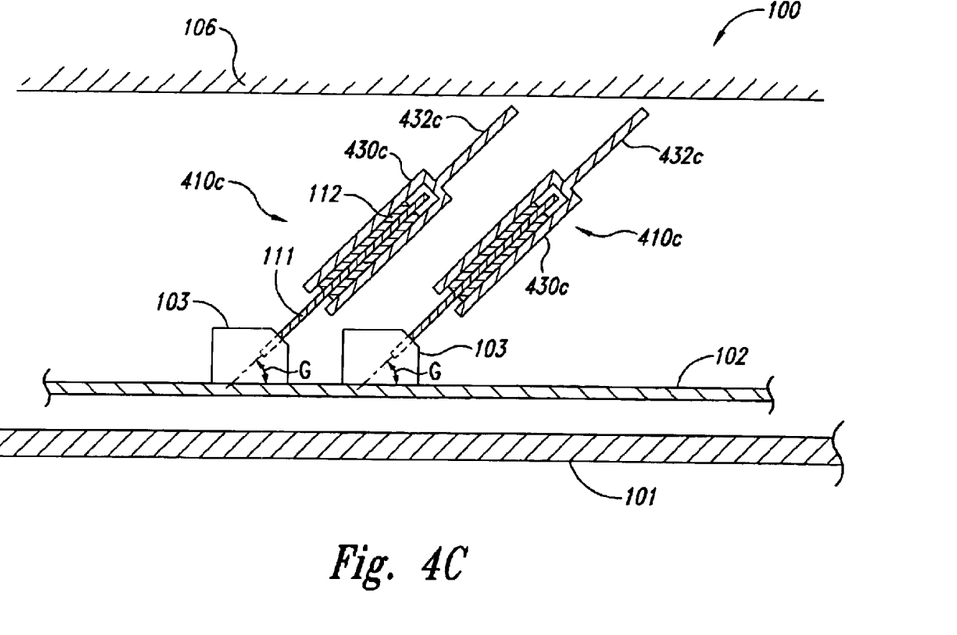
Figure 4D:
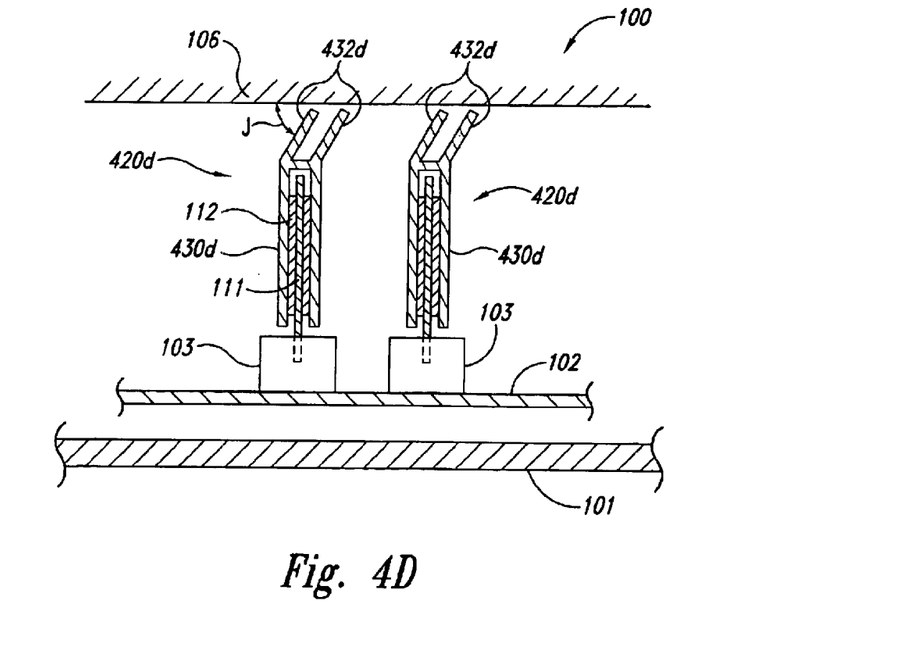

In another embodiment shown in FIG. 4B, a computer or other electronic device 100 can support module assemblies 410b having a different arrangement of heat transfer fins 432b. In one aspect of this embodiment, the heat transfer fins 432b can extend generally normal to the support 102 and the adjacent structure 106. In another aspect of this embodiment, the heat transfer fins 432b can be attached to a module 420 that is inclined at an acute angle H having a value less than that of angle G shown in FIG. 3. In a particular aspect of this embodiment, the acute angle H can be about 30 degrees. In other embodiments, the acute angle H can have other values. In any of these embodiments, the heat transfer fins 432b can enhance the rate at which heat is removed from the corresponding module 420 without interfering with the heat transfer fins 432b of the adjacent module 420. For example, each module 420 can be generally parallel to its neighbor, and the heat transfer fins 432b of each module assembly 410b can be generally parallel to those of the neighboring module assembly 410b.

In still another embodiment (shown in FIG. 4C) a computer or other electronic device 100 can support a plurality of module assemblies 410c, each inclined at an acute angle G relative to the support 102, and each having a heat transfer device 430c with a single heat transfer fin 432c. In one aspect of this embodiment, the heat transfer fins 432c can also be inclined at the acute angle G. Accordingly, adjacent modules 420c can be generally parallel to each other, and the heat transfer fins 432c of adjacent module assemblies 410c can also be generally parallel to each other as described above. This arrangement can allow close spacing between adjacent module assemblies 410c while permitting enhanced heat transfer from each module assembly 410c.

In still a further embodiment (shown in FIG. 4D) a computer or other electronic device 100 can support module assemblies 420d that do not overlap each other but instead extend generally normal to the support 102 and the adjacent structure 106. Each module assembly 420d can include an integrally formed heat transfer device 430d having heat transfer fins 432d. In one aspect of this embodiment, the heat transfer fins 432d can be oriented at an acute angle J relative to the support 102 and/or the adjacent structure 106. Accordingly, adjacent module assemblies 410d can be generally parallel to each other, and the heat transfer fins 432d of adjacent module assemblies 410d can also be generally parallel to each other.

From the foregoing, it will be appreciated that specific embodiments of the invention have been described herein for purposes of illustration, but that various modifications may be made without deviating from the spirit and scope of the invention. Other embodiments of the invention can include the features described above arranged in combinations not explicitly described with reference to FIGS. 2–4D. Accordingly, the invention is not limited except as by the appended claims.

We claim:

1. An apparatus for transferring heat from a microelectronic device, comprising:

a first heat transfer portion positioned to face toward a first surface of a microelectronic device module;

a second heat transfer portion positioned to face toward a second surface of the microelectronic device module, the second heat transfer portion facing generally opposite from the first heat transfer portion, at least a part of the first heat transfer portion being spaced apart from the second heat transfer portion to receive the microelectronic device module;

an intermediate portion disposed between the first and second heat transfer portions;

a first heat transfer fin having a first length and extending away from at least one of the first heat transfer portion, the second heat transfer portion and the intermediate portion; and a second heat transfer fin extending away from at least one of the first heat transfer portion, the second heat transfer portion and the intermediate portion, the second heat transfer fin having a second length different than the first length.

2. The apparatus of claim 1 wherein the first heat transfer fin is integrally connected with at least one of the first heat transfer portion, the second heat transfer portion and the intermediate portion, and wherein the second heat transfer fin is integrally connected with at least one of the first heat transfer portion, the second heat transfer portion and the intermediate portion.

3. The apparatus of claim 1 wherein the first and second heat transfer fins are the only heat transfer fins of the apparatus.

4. The apparatus of claim 1 wherein the first and second heat transfer portions are generally parallel and wherein the first and second heat transfer fins extend generally normal to the first and second heat transfer portions.

5. The apparatus of claim 1 wherein the first heat transfer fin is positioned closer than the second transfer heat fin to the intermediate portion, and wherein the first length of the first heat transfer fin in less than the second length of the second heat transfer fin.

6. The apparatus of claim 1 wherein an opening is positioned between the first and second heat transfer portions, the opening being sized to receive the microelectronic device module, and wherein the second heat transfer fin is positioned closer than the first heat transfer fin to the opening, further wherein the second heat transfer fin is longer than the first heat transfer fin.

7. A computer assembly, comprising:
- a connector configured to mount to a support having a support plane, the connector having a receptacle with an insertion axis oriented at an acute angle relative to the support plane;
- a microelectronic device module having at least a portion received in the receptacle, the microelectronic device module having a first side and a second side facing opposite from the first side, the microelectronic device module including at least one microelectronic device;
- a heat transfer unit coupled to the microelectronic device module, the heat transfer unit including a heat transfer portion facing toward the microelectronic device module and extending generally parallel to the insertion axis, the heat transfer unit further including first and second heat transfer fins integrally formed with and extending away from the heat transfer portion.

8. The assembly of claim 7 wherein the heat transfer portion includes a first heat transfer portion facing toward the first side of the microelectronic device module, and wherein the heat transfer unit includes a second heat transfer portion facing toward the second side of the module, and an intermediate portion extending between the first and second portions, with the microelectronic module positioned between the first and second heat transfer portions.

9. The assembly of claim 7 wherein the heat transfer portion includes a first heat transfer portion facing toward the first side of the microelectronic device module, and wherein the heat transfer unit includes a second heat transfer portion facing toward the second side of the module, and an intermediate portion extending between the first and second portions, with the microelectronic module positioned between the first and second heat transfer portions, further wherein the first fin has a first length and the second fin has a second length different than the first length.

10. The assembly of claim 7, further comprising a clip positioned to releasably secure the heat transfer unit to the microelectronic device module.

11. The assembly of claim 7 wherein the heat transfer unit is attached to the microelectronic device module with at least one fastener.

12. The assembly of claim 7 wherein the heat transfer portion and the insertion axis are oriented at an angle of from about 30 degrees to about 60 degrees relative to the support plane.

13. The assembly of claim 7 wherein the heat transfer portion and the insertion axis are oriented at an angle of about 45 degrees relative to the support plane.

14. The assembly of claim 7 wherein the at least one microelectronic device includes a memory chip.

15. The assembly of claim 7 wherein the first heat transfer fin has a first length and the second heat transfer fin has a second length different than the first length.

16. The assembly of claim 7 wherein the first and second heat transfer fins terminate at approximately the same distance from the support plane.

17. An apparatus for transferring heat from a microelectronic device module, comprising:
- a first generally planar heat transfer portion positioned to abut against a first surface of a microelectronic device module, the first heat transfer portion having a first end region and a second end region;
- a second generally planar heat transfer portion positioned to abut against a second surface of the microelectronic device module, the second heat transfer portion facing generally opposite from the first heat transfer portion and having a first end region and a second end region, the first and regions of the first and second heat transfer portions being spaced apart from each other to receive the microelectronic device module;
- an intermediate portion positioned between the second regions of the first and second heat transfer portions;
- a first heat transfer fin having a first length and extending away from at least one of the first, second and intermediate portions; and
- a second heat transfer fin extending away from at least one of the first, second and intermediate portions, the second heat transfer fin having a second length different than the first length.

18. The apparatus of claim 17 wherein the first heat transfer fin is integrally connected with at least one of the first heat transfer portion, the second heat transfer portion and the intermediate portion, and wherein the second heat transfer fin is integrally connected with at least one of the first heat transfer portion, the second heat transfer portion and the intermediate portion.

19. The apparatus of claim 17 wherein the first and second heat transfer fins are the only heat transfer fins of the apparatus.

20. The apparatus of claim 17 wherein the first and second heat transfer portions are generally parallel and wherein the first and second heat transfer fins extend generally normal to the first and second heat transfer portions.

21. The apparatus of claim 17 wherein the first heat fin is positioned closer than the second heat fin to the intermediate portion, and wherein the first length of the first heat fin in less than the second length of the second heat fin.

22. A computer assembly, comprising:
- a support having a support plane;
- a connector carried by the support, the connector having a receptacle with an insertion axis;
- a microelectronic device module having at least one microelectronic device and having at least a portion received in the receptacle; and
- a heat sink having a first portion, a second portion facing opposite from the first portion and an opening into which the microelectronic device module is received, the heat sink further having at least one fin extending away from the module at an acute angle relative to the support.

23. The assembly of claim 22 wherein the insertion axis is positioned at an acute angle relative to the support plane.

24. The assembly of claim 22 wherein the at least one fin includes a first fin and wherein the heat sink further includes a second fin, with the first fin having a first length and the second fin having a second length different than the first length.

25. The assembly of claim 22 wherein the at least one fin is generally non-parallel with the insertion axis.

26. A computer assembly, comprising:
a support having a support plane;
a first connector carried by the support, the first connector having a receptacle with a first insertion axis positioned at an acute first angle relative to the support plane;
a second connector carried by the support, the second connector having a receptacle with a second insertion axis positioned at an acute second angle relative to the support plane, the second angle being at least approximately the same as the first angle;
a first module received in the first receptacle, the first module including at least one microelectronic device and having a first end region spaced apart from the support;
a second module received in the second receptacle, the second module including at least one microelectronic device and having a second end region spaced apart from the support;
a first heat sink carried by the first module and having at least one first fin oriented at an acute third angle relative to the support plane;
a second heat sink carried by the second module and having at least one second fin oriented at an acute fourth angle relative to the support plane, the at least one second fin being positioned proximate to the first end region of the first module, with the first end region being interposed between the at least one second fin and the support.

27. The assembly of claim 26 wherein the first heat sink has a first opening into which the first module is received, and wherein the second heat sink has a second opening into which the second module is received.

28. The assembly of claim 26, further comprising a clip positioned to releasably secure the heat transfer unit to the microelectronic module.

29. The assembly of claim 26 wherein the first module includes a first face and a second face facing opposite from the first face, and wherein the first heat sink includes a first portion facing toward the first face, a second portion positioned facing toward the second face, and an intermediate portion between the first and second portions, further wherein the intermediate portion is interposed between the support and the at least one second fin of the second heat sink.

30. An apparatus for transferring heat from a microelectronic device module, comprising:
first heat transfer means for receiving heat from a microelectronic device module, the first heat transfer means being shaped to face toward a first surface of the module;
second heat transfer means for receiving heat from the microelectronic device module, the second heat transfer means being shaped to face toward a second surface of the microelectronic device module, the second heat transfer means facing generally opposite from the first heat transfer means, at least a part of the first heat transfer means being spaced apart from the second heat transfer means to receive the microelectronic device module;
an intermediate portion disposed between the first and second heat transfer means;
first fin means for transferring heat away from at least one of the first and second heat transfer means, the first fin means having a first length; and
second fin means for transferring heat away from at least one of the first and second heat transfer means, the second fin means having a second length different than the first length.

31. The apparatus of claim 30 wherein the first fin means is integrally connected with at least one of the first heat transfer means, the second heat transfer means and the intermediate portion, and wherein the second fin means is integrally connected with at least one of the first heat transfer means, the second heat transfer means and the intermediate portion.

32. The apparatus of claim 30 wherein the first and second heat transfer means are generally parallel and wherein the first and second fin means extend generally normal to the first and second heat transfer means.

33. The apparatus of claim 30 wherein the first fin means is positioned closer than the second fin means to the intermediate portion, and wherein the first length of the first fin means is less than the second length of the second fin means.

34. A method for manufacturing a computer, comprising:
mounting a connector to a support, the support having a support plane, the connector having a receptacle with an insertion axis oriented at an acute angle relative to the support plane;
electrically coupling a microelectronic device module to the connector by inserting at least a portion of the microelectronic device module into the receptacle along the insertion axis, the microelectronic device module having a first side, a second side facing opposite from the first side and at least one microelectronic device; and
coupling a heat transfer unit in thermal communication with the microelectronic device by positioning a heat transfer portion of the heat transfer device to face toward the module, the heat transfer portion extending generally parallel to the insertion axis, the heat transfer device further including a first heat transfer fin having a first length and extending away from the heat transfer portion, the heat transfer device still further including a second heat transfer fin having a second length different than the first length and extending away from the heat transfer portion.

35. The method of claim 34 wherein the microelectronic device module includes a first microelectronic device positioned on the first side of the microelectronic device module and a second microelectronic device positioned on the second side of the microelectronic device module, further wherein the heat transfer portion includes a first heat transfer portion and wherein the heat transfer unit includes a second heat transfer portion, further wherein coupling the heat transfer unit includes receiving the microelectronic device module between the first and second heat transfer portions.

36. A method for manufacturing a computer, comprising:
mounting a first connector to a support, the first connector having a first receptacle with a first insertion axis positioned at an acute first angle relative to the support;
mounting a second connector to the support, the second connector having a second receptacle with a second insertion axis positioned at an acute second angle relative to the support, the second angle being at least approximately the same as the first angle;
receiving a first microelectronic device module in the first receptacle, the first microelectronic device module including at least one microelectronic device and having a first end region spaced apart from the support;
receiving a second microelectronic device module in the second receptacle, the second module including at least one microelectronic device and having a second end region spaced apart from the support;

positioning a first heat sink in thermal communication with the first module, with at least one first fin of the first heat sink oriented at an acute third angle relative to the support; and positioning a second heat sink in thermal communication with the second module, with at least one second fin oriented at an acute fourth angle relative to the support, the at least one second fin being positioned proximate to the first end region of the first module, with the first end region being interposed between the at least one second fin and the support.

37. The method of claim 36 wherein positioning a first heat sink includes positioning a first heat sink having at least two first fins, with one first fin having a different length than that of the other.

38. The method of claim 36 wherein positioning a first heat sink includes positioning a first heat sink having at least two first fins, with one first fin having a different length than that of the other and with ends of both first heat sinks being positioned at approximately the same distance from the support.

* * * * *